United States Patent [19]

Hiemstra et al.

[11] Patent Number: 5,428,513

[45] Date of Patent: Jun. 27, 1995

[54] COVERED VANITY MIRROR AND FLEXIBLE CIRCUIT

[75] Inventors: David L. Hiemstra, Byron Center; Paul T. Vander Kuyl, Holland, both of Mich.

[73] Assignee: Prince Corporation, Holland, Mich.

[21] Appl. No.: 154,216

[22] Filed: Nov. 17, 1993

[51] Int. Cl.6 .............................................. F21V 33/00
[52] U.S. Cl. ..................................... 362/143; 362/137; 362/141; 362/144; 296/97.5
[58] Field of Search .................... 296/97.5, 97.1, 97.2, 296/97.3; 362/144, 143, 141, 137, 135, 136

[56] References Cited

U.S. PATENT DOCUMENTS

| | | | |
|---|---|---|---|
| 2,060,062 | 11/1936 | Fischer | 362/140 X |
| 4,174,864 | 11/1979 | Viertel et al. | 362/135 |
| 4,421,355 | 12/1983 | Marcus | 362/144 |
| 4,486,819 | 11/1984 | Marcus et al. | 362/142 |
| 4,511,954 | 4/1985 | Marcus et al. | 362/275 |
| 4,541,663 | 9/1985 | Schwanitz et al. | 362/144 |
| 4,792,884 | 12/1988 | Suman et al. | 362/135 |
| 4,794,497 | 12/1988 | Jönsas et al. | 362/137 X |
| 4,879,637 | 11/1989 | Clark et al. | 362/141 |
| 4,979,079 | 12/1990 | Tawsaya | 362/135 |
| 5,162,950 | 11/1992 | Suman et al. | 362/135 X |
| 5,205,635 | 4/1993 | Van Order et al. | 362/83.1 |

Primary Examiner—Ira S. Lazarus
Assistant Examiner—Thomas M. Sember
Attorney, Agent, or Firm—Price, Heneveld, Cooper, DeWitt & Litton

[57] ABSTRACT

A vanity (mirror assembly includes a flexible circuit which extends between a movable cover and a vanity mirror frame and provides circuit capabilities for mounting lamps on either the cover or vanity mirror frame. Other circuit elements such as control switches, dimming controls, and the like can be mounted on the opposite side of the vanity mirror package so that a relatively thin visor with spaced-apart circuit elements can be provided. In the preferred embodiment of the invention, the circuit comprises a flexible insulative substrate which comprise first and second circuit panels integrally interconnected by a bridge. Conductive elements are screen printed on the first and second circuit panels and on the bridge which extends across the pivot connection of the cover to the mirror frame while coupling the first and second circuit panels.

31 Claims, 4 Drawing Sheets

COVERED VANITY MIRROR AND FLEXIBLE CIRCUIT

BACKGROUND OF THE INVENTION

The present invention relates to a vanity mirror and particularly to an electrical circuit for providing operating power to illumination means for a covered illuminated vanity mirror.

Illuminated vanity mirror visors have become popular vehicle accessories for providing vehicle operators and passengers with an illuminated vanity mirror for use of the mirror under low ambient light conditions. A variety of lighting effects have been provided for such illuminated vanity mirrors including those associated with visors. U.S. Pat. No. 4,879,637 discloses a system by which a variable light intensity can be provided. U.S. Pat. No. 4,792,884 discloses another system for providing illumination to opposite edges of a vanity mirror. U.S. Pat. Nos. 4,421,355, 4,486,819 and 4,511,954 disclose other examples of providing illumination for use of a vanity mirror and particularly mirrors associated with automotive visors. It is also well known to provide illumination to a vanity mirror which is located in an area separate from the mirror as, for example, above a mirror which pivots down to a use position as represented by U.S. Pat. No. 2,060,062. U.S. Pat. Nos. 4,174,864 and 4,541,663 also teach an illuminated vanity mirror visor in which the illumination means is located in the cover above the mirror while the mirror is located in the body of the visor.

There are a number of structural variations for illuminated vanity mirror visors. Methods for providing electrical operating power to illumination means such as lamps has also included a variety of structure including conventional electrical conductors, circuit boards, and Mylar film with printed or screened conductive ink as illustrated in U.S. Pat. Nos. 5,205,635 and 5,162,950.

When mounting the illumination means on the cover or on a member which moves with respect to the mirror or the visor body, it is necessary to provide an electrical connection between the movable elements. This has taken the form of contacts mounted to the cover and visor body which engage when the cover is open. Such electrical contacts must be carefully aligned and can become unreliable due to wear, dirt, or even oxidation of the contacts if infrequently used. As a result, the electrical connection of lamp means associated with, for example, a mirror or a visor cover which move with respect to the body of the visor which receives the operation power from the vehicle has not been wholly acceptable.

SUMMARY OF THE PRESENT INVENTION

The vanity mirror assembly of the present invention overcomes the problems with the prior art by providing a circuit which extends between a movable cover and vanity mirror frame and provides circuit capabilities for illumination means on either the cover or vanity mirror frame and separate circuit elements such as control switches, dimming controls, and the like on the opposite side. This flexibility allows the illumination means as well as the switch and dimming means to be spaced at different parts of this vanity mirror package so that a relatively thin vanity mirror package with spaced-apart circuit elements can be provided. The package is particularly well suited for use in a vehicle visor.

In the preferred embodiment of the invention, the circuit comprises a flexible insulative substrate on which the electrical circuit is screen printed. It is capable of receiving sockets for holding the illumination means such as cartridge lamps and printed-on resistors for providing control for the illumination means.

In one embodiment of the invention, a covered vanity mirror includes circuit means which comprise first and second circuit panels integrally interconnected by a bridge. Conductive elements are screen printed on the first and second circuit panels and on the bridge which extends across the pivot connection of the cover to the mirror frame while coupling the first and second circuit panels. In one embodiment lamp socket means are mounted directly to conductors of one of the circuit panels and in one embodiment a variable resistance is mounted on a second circuit panel. According to another aspect of the invention, an improved cover mounting structure is also provided.

In a preferred embodiment of the invention, the first circuit panel is located in the cover adjacent to the pivot axis of the cover, and the second circuit panel is positioned behind the vanity mirror with the bridge section extending over the hinge coupling the cover to the mirror. Such construction allows for a relatively thin and compact vanity mirror by splitting the circuit into two sections and provides reliable interconnection of the constituent circuit elements through a flexible conductive bridge. This construction also reduces the cost due to the manufacturing of the circuit elements as well as their attachment to one another and to the vanity mirror package. These and other features, objects, and advantages of the present invention will become apparent upon reading the following description thereof together with reference to the accompanying drawings in which:

DETAILED DESCRIPTION OF THE PREFERRED EMBODIMENT

Figure 1:
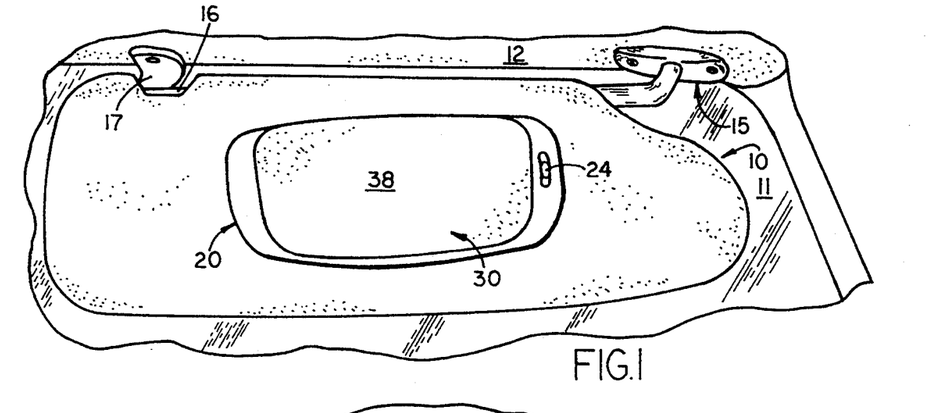
FIG. 1 is a front elevational view of a covered vanity mirror visor embodying the present invention and shown with the cover in a closed position.
Figure 2:
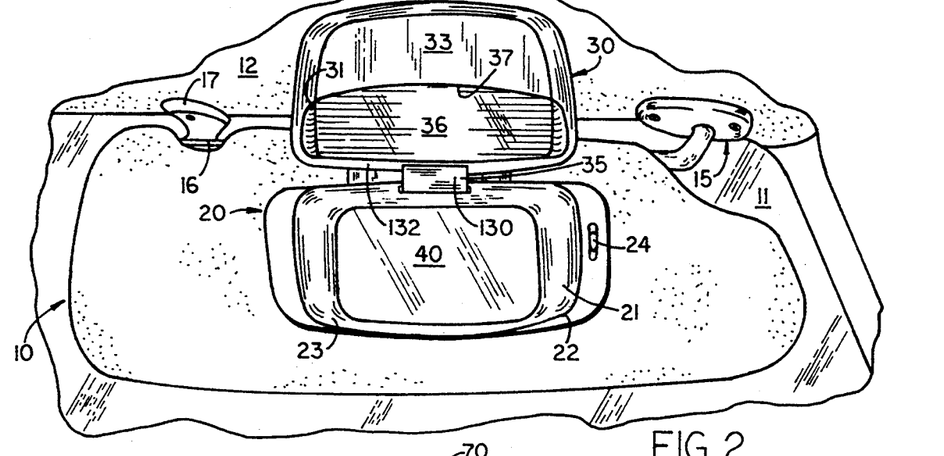
FIG. 2 is a front elevational view of the vanity mirror visor shown in FIG. 1 shown with the cover in an open position for use of the vanity mirror.

Referring initially to FIGS. 1 and 2, there is shown a visor 10 mounted to the roof 12 of a vehicle such as an automobile, the visor shown being mounted to the passenger's side and shown in a lowered use position for blocking sunlight along the top edge of the vehicle windshield 11. The visor includes a visor body which can be made of a folded polymeric core or other suitable construction and includes an illuminated vanity mirror package 20 embodying the present invention. The visor is mounted to the vehicle roof at one end by means of a conventional visor pivot bracket assembly 15 and at an opposite end by an auxiliary clip 16 which snap-fits within a socket 17 for supporting the end of the visor 10 opposite bracket 15 for movement between a raised stored position adjacent to the vehicle roof to a lowered use position as illustrated in FIGS. 1-2. This mounting arrangement also allows the visor to move to the side window use position in a conventional manner.

The illuminated vanity mirror assembly 20 includes a cover 30 shown in FIG. 2 in a raised position exposing a vanity mirror 40 which is mounted within a mirror frame 22 to which cover 30 is pivotally coupled by means of a hinge assembly 35 shown in greater detail in FIGS. 8-20 described below. Cover 30 includes illumination means including a lens 36 extending continuously along an edge immediately adjacent to hinge 35 for providing illumination for the face of a user of the vanity mirror 40 during low ambient light conditions. The vanity mirror assembly 20 includes a light-controlled dimmer slide 24 mounted in a slot 23 on the right leg of mirror frame 22 for controlling the intensity of light from the lamps positioned behind lens 36 such that the intensity of illumination can be controlled when the cover is moved to an open position and the lamps actuated. Having briefly described the visor and illuminated vanity mirror, a more detailed description of the circuit which extends both into the cover 30 and behind the mirror frame 22 is now described in detail in connection with FIGS. 3-6.

Figure 3:
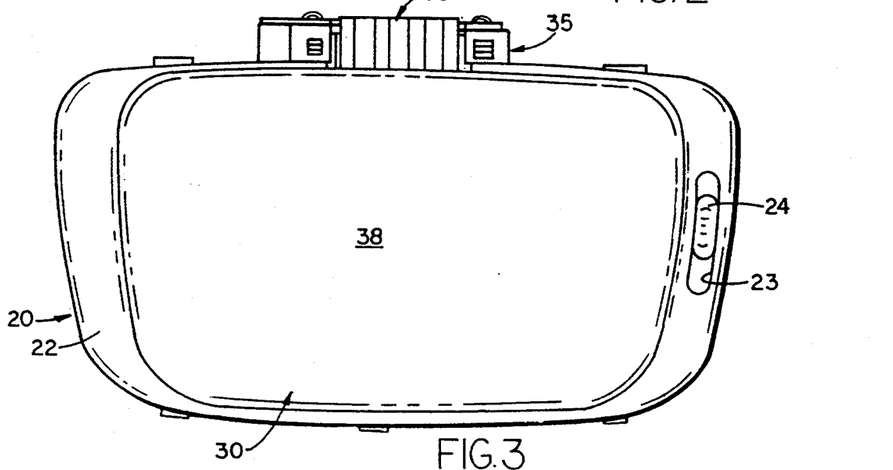
FIG. 3 is an enlarged front elevational view of the vanity mirror package shown in FIGS. 1-2.
Figure 4:
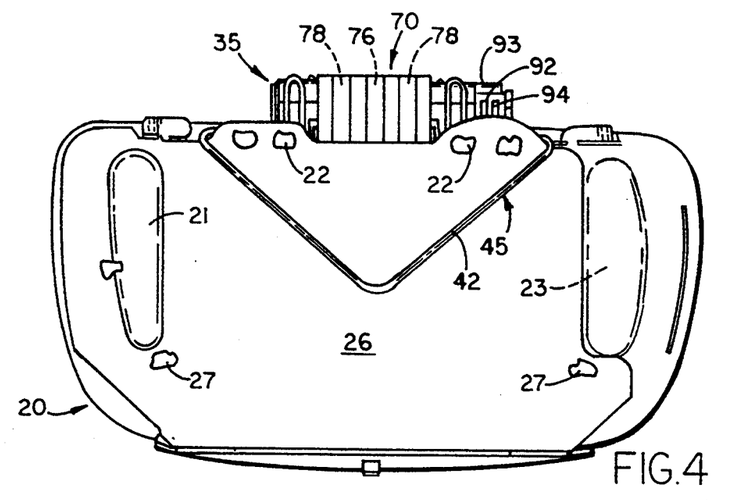
FIG. 4 is a rear elevational view of the vanity mirror package shown in FIG. 3.
Figures 5, 10:
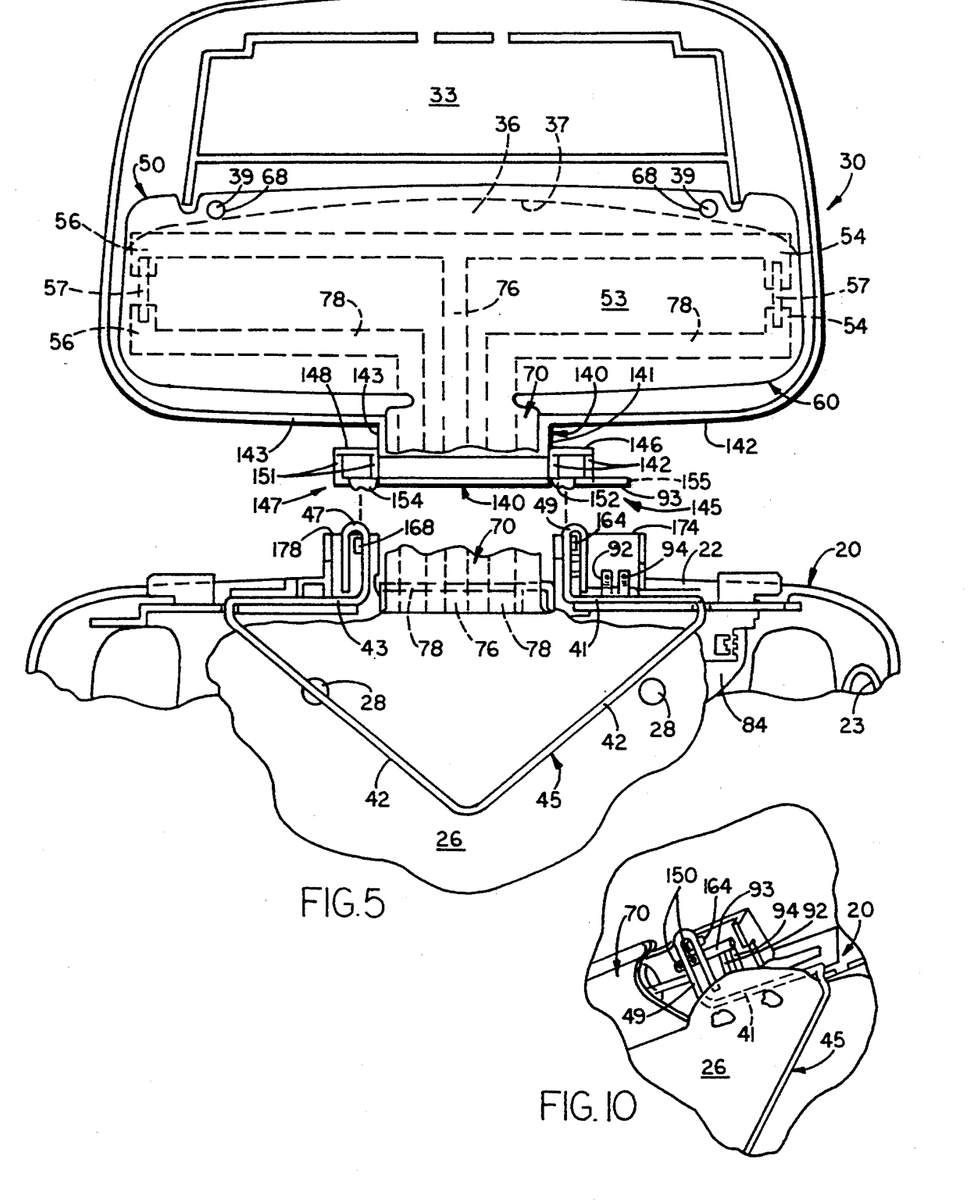
FIG. 5 is a fragmentary rear and partly exploded view of the cover and vanity mirror frame showing the mounting of the circuit of the present invention thereto.
FIG. 10 is an enlarged fragmentary perspective view of a portion of the hinge structure shown in FIG. 8.
Figure 6:
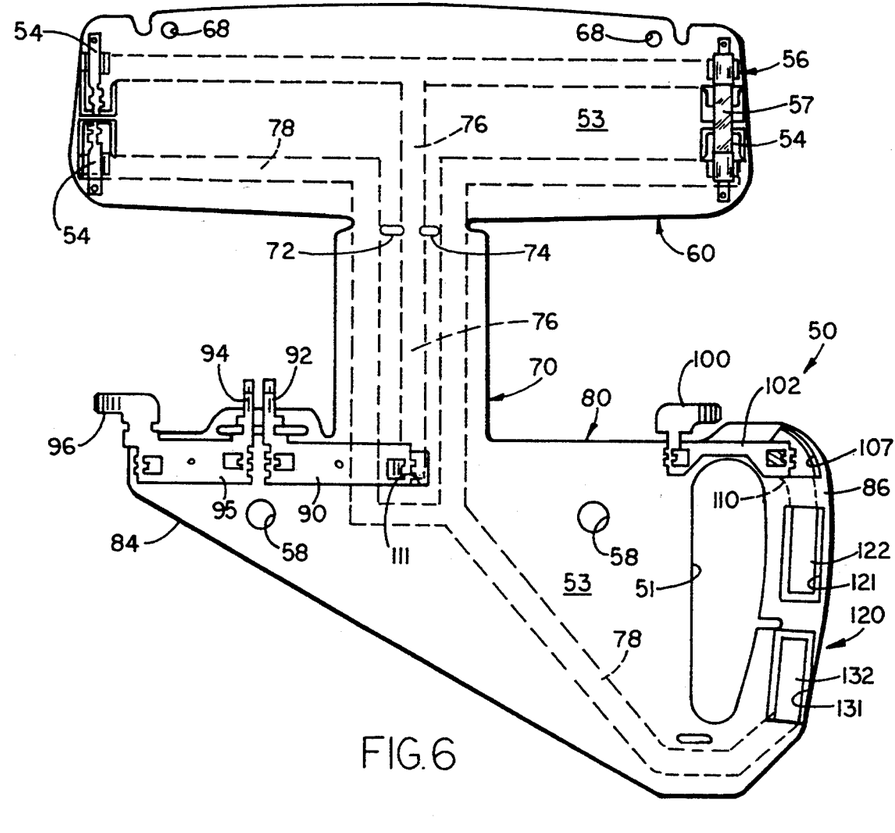
FIG. 6 is an enlarged front elevational view of the circuit shown in FIG. 5.
Figure 7:
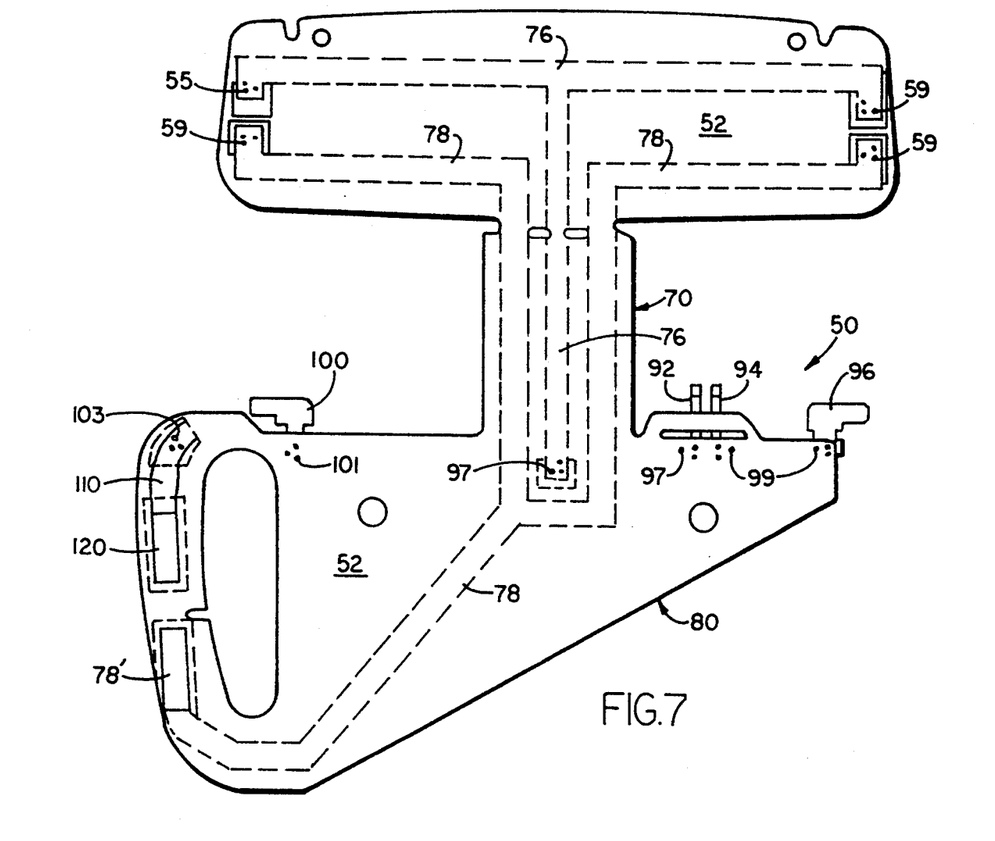
FIG. 7 is rear elevational view of tile circuit shown in FIG. 6.

The electrical circuit 50 as best seen in FIGS. 5-7 has a first circuit panel 60, a second circuit panel 80, and a bridging circuit section 70 integrally coupling panels 60 and 80. The bridging section 70 extends over and behind the hinge 35 of cover 30 as best seen in FIGS. 3 and 4 with circuit panel 60 extending behind lens 36 which is mounted within an aperture 37 on an inner cover panel 33 (FIG. 2). The cover further including an outer decorative panel 38 such that circuit panel 60 is sandwiched between the two panels 33 and 38 (FIGS. 1 & 3) which are welded together. For such purpose, the bridge section 70 of circuit 50 includes a pair of apertures 72 and 74 to allow the edge of panels 33 and 38 of cover 30 immediately adjacent hinge 35 to be welded through the circuit 50.

Circuit 50 comprises three layers with an underlying substrate 52 (FIG. 7) made of Mylar and having a thickness of approximately 0.005 inches. The first circuit panel 60 is generally rectangular and includes a pair of lamp receiving sockets 54 and 56 directly mounted on circuit 50 with integral conductive staple prongs 55 and 59 respectively, extending through the Mylar substrate and bent over to mechanically hold the sockets to circuit 50 and also make electrical contact with conductors 76 and 78 as best seen in FIG. 7 into electrical engagement with first and second conductive strips 76 and 78. Strips 76 and 78 define the ground conductor and positive supply conductor respectively of the power supply for lamps such as lamp 57 mounted in socket 56. Lamp 57 is a standard cartridge-type bulb which snap-fits within the sockets 54 and 56 to provide illumination behind lens 36 at the opposite corners thereof for providing illumination from the edge of cover 30 immediately adjacent mirror 40. Lens 36 and a reflective surface on the inside of panel 38 effectively provide a band of light across the top of the mirror as seen in FIG. 2.

Conductor 76 of circuit 50 is generally a T-shaped conductor communicating with the upper contacts of each of the cartridge sockets 54 and 56 and extends centrally down through bridge 70 terminating a first electrical switch contact 90 (FIG. 6) which is a phosphor bronze contact having a contact finger 92 extending upwardly and outwardly from frame 22 and engages a shorting bar 93 mounted to extension 115 of the cover hinge 35 for providing electrical contact from a ground contact terminal 96 through a second wiper contact finger 94 coupled to contact 95. Contacts 90 and 95 are stapled to the Mylar substrate 52 with contact 90 engaging conductor 76 with staple prongs 97 and contact 95 engaging substrate 52 by integral staple prongs 99 (FIG. 7). The staple prongs are integrally formed generally triangular projections extending from members 90 and 95 and mechanically attach these conductive members to circuit 50 and electrically couple contact 90 to conductor 76 by piercing through insulative layer 53, through conductor 26 and then through substrate 52. Similarly constructed prongs of sockets 54 and 56 mount them to the circuit as well as conductor 102 discussed below.

Circuit 50 receives the positive supply voltage from electrical contact 100 which communicates with an electrical contact 102 stapled to the Mylar substrate by staple prongs 101 and 103 (FIG. 7) engage a stub-electrical conductor 110 communicating with a resistive ink strip 122 to define a variable resistance 120 in connection with slide 24 which includes a contact strip which rides along the facing surface 122 (FIG. 6) of resistive ink strip 122 and a contact surface 132 of resistive ink (strip?) which is printed over an end 78' (FIG. 7) of conductor 78.

As best seen in FIGS. 6-7, conductor 78 extends upwardly through the second circuit panel 80 terminating in a U-shaped configuration with parallel spaced legs extending through bridge section 70 and to the lower terminals of sockets 54 and 56 and communicating with the lower terminal of these sockets through staples 55 and 59 associated with the lower sections of each of the sockets 54 and 56 respectively. A sliding contact arm 24 associated with the mirror frame 22 includes a brass strip having a length which spans across resistive ink pad 122 and contact pad 132 associated with conductor 78 such that by sliding control knob 24 upwardly or downwardly, a decreasing and increasing amount of resistance respectively is injected in series with the power supply conductor 78 to lamps 57. Thus, with the control fully upward, a minimum resistance is provided in series with the lamps to provide maximum illumination. With the slide moved downwardly, the tip of the bridging conductor is at the lower end of resistance pad 122 providing a maximum amount of resistance. The current path with cover 30 in an open position is frown the vehicle electrical supply coupled by a conductor to terminal 100 to terminal 96 which is coupled to the systems ground via a conductor. The circuit path includes variable resistance 120, conductor 78, lamps 57, conductor 76, shorted contacts 92 and 94 (shorted by shorting bar 93 on cover hinge 35), through contact 95 to terminal 96. The circuit 50 includes a polymeric ink dielectric coating 53 printed on the top surface (FIG. 6) to insulate conductors 76 and 78 except in areas 107, 111, 121, and 131 where contact with the phospher bronze and brass contact members is desired.

The circuit 50 is manufactured by die-cutting the Mylar film 52 in the configuration shown in FIGS. 6–7, screen printing conductors 76 and 78 which are of a silver polymeric thick film material. Subsequently, the resistive ink pad 122 is screen printed using a carbon ink, and the end 78' of conductor 78 is also screen printed at 132 to provide a conductive surface for the light control slide 24. Next, the dielectric coating 53 is printed over the Mylar film, conductors 76 and 78, and resistive ink sections 120 and 132 leaving exposed contact areas 107 (FIG. 6) for electrically and conductively engaging terminal strip 102 and areas 121 and 131 associated with resistor 120 and pad 132 for exposing the surfaces for the slide control 24. Also, an area 111 is masked to expose the lower end of conductor 76 for improved electrical engagement with conductive strip 90. Next, the lamp sockets 54 and 56, including upper and lower sections, are stapled through the dielectric, the conductors 76 and 78 and mechanically secured to the substrate 52. Similarly, terminals 90 and 95, which may be initially integral and subsequently cut to separate them into separate circuit strips, are stapled onto the triangular corner 84 of circuit panel 80 and conductive strip 102 stapled to the enlarged end 86 of circuit panel 80 as seen in FIG. 6.

The circuit 50 also includes an elongated oval die-cut opening 51 providing clearance for recess 21 (FIG. 4) in mirror frame, which also includes a recess 23 on the opposite side of mirror 40 for receiving the inwardly projecting edges 31 of lens 36 and cover 30. This construction provides a relatively thin vanity mirror package 20 in which the electrical circuit is divided between the area behind the mirror 40 which, as seen in FIG. 4, is enclosed with a backing panel 26 heat-staked at several locations 27 to the back of mirror frame 22. Panel 26 also includes a cut out for receiving the recessed area 21 of mirror frame 22 as best seen in FIG. 4. A cover spring 45 extends between mirror frame 22 behind fiberboard panel 26 and into engagement with the cover hinge 35 for providing snap opened and closed operation of the cover as described below. The shorting bar 93 (FIG. 4) is out of engagement with contacts 92 and 94 when the cover is closed as seen in FIG. 4 but extends across contacts 92 and 94 to illuminate lamps 57 when the cover is open as seen in FIG. 2.

As seen in FIGS. 4–5, circuit section 80 extends between the rear surface of visor panel 22 and the mating surface of reinforcing panel 26 and is held in position sandwiched therebetween in part by a pair of indexing tabs 28 (FIG. 5) which extend through apertures 58 formed in circuit panel 80 in aligned relationship with respect to the cover section. Similarly, circuit section 60 include indexing apertures 68 which extend over indexing tabs 39 (FIG. 5) on the inner surface of cover panel 35 for holding the upper circuit panel 60 in aligned relationship during assembly. Apertures 72 and 74 through which cover panels 35 and 38 are fused also assist in fixedly mounting circuit section 60 to the cover between panels 35 and 38.

Figure 8:
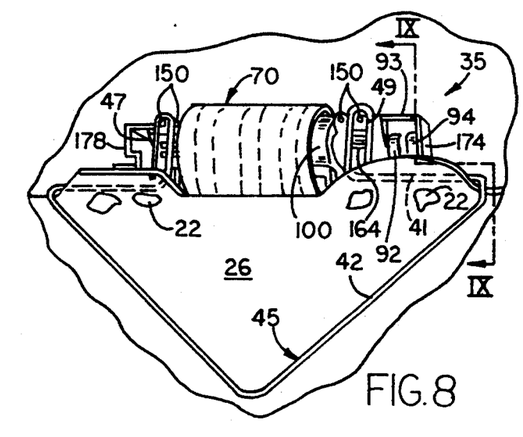
FIG. 8 is an enlarged fragmentary rear perspective view of tile cover hinge.

The hinge construction for attaching cover 30 to mirror frame 22 is described in connection specifically with FIGS. 5 and 8–10. The hinge mechanism attached to cover 30 includes the curvilinear or arcuate arm 140 extending frown an edge 142 of the cover as best seen in FIGS. 2, 5 and 8 over which the bridge section 70 of circuit 50 extends. Extending frown opposite ends 141 and 143 of curvilinear arm 140 are offset pivot members 145 and 147 respectively, which are in the form of a pivot rod 146 and 148 respectively supported by an open frame, including a pair of spaced legs 149 and 151 respectively which are supported by legs 152 and 154 respectively extending outwardly from edges 141 and 143 respectively of arm 140. This hinge socket and pivot axle construction by itself is substantially similar to that disclosed in U.S. patent application Ser. No. 07/949,571 filed on Sep. 22, 1992, and entitled Visor Mirror Cover Assembly owned by the present assignee, the disclosure of which is incorporated herein by reference. Extending from leg 152 is a stub axle 155 over which the cylindrical conductive shorting bar 93 is mounted for engaging contacts 92 and 94 as seen in FIGS. 4 and 10.

Figure 9:
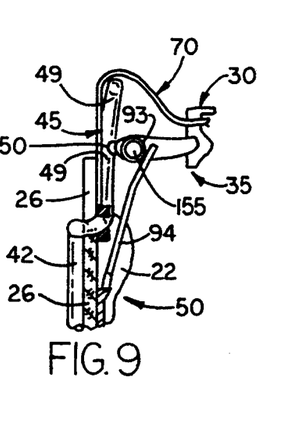
FIG. 9 is a fragmentary cross-sectional view taken along section line IX—IX in FIG. 8.

The pivot rods 146 and 148 snap-fit within sockets 164 and 168 respectively formed in projections 174 and 178 of mirror frame 22 to pivotally couple cover 30 to the resilient polymeric sockets 174 and 178 of mirror frame 22. This allows the cover 30 to pivot between a closed position as seen in FIGS. 1 and 8 through a partially open position shown in FIG. 9 to a fully open position shown in FIGS. 2 and 10. The spring 45 engages as best seen in FIGS. 8–10, the offset arms 152 and 154 of the hinge assembly for cover 30; and for such purpose, spring 45 is configured to include a triangular portion 42 which extends behind the backing cover 26 behind mirror 40 and inwardly projecting legs 41 and 43 extending along and behind backing member 26 and terminating in upwardly projecting loops 47 and 49 which engage as best seen in FIGS. 4 and 8–10 to legs 152 and 154 of the hinge mechanism. Each of the legs 41 and 43 of spring 45 is seated in a channel 46 (FIG. 9) of frame 22 and held therein by backing member 26. For purposes of aligning spring loops 47 and 49 with legs 152 and 154 offset from pivot axles 146 and 148. Each of the legs includes a pair of spaced guide dimples 150 which ride along the opposite edges of the inner leg of loops 47 and 49 of spring 45 as best seen in FIGS. 8 and 10 as the cover is opened to contain the spring legs in alignment and in engagement with the offset legs of the hinge assembly. The torsion spring 45 so defined provides a compressive force against the offset legs of the hinge assembly to provide over-center spring action for controlling the cover between snap-open and snap-closed positions. By providing a spring steel wire spring 45 of relatively large dimension which overlies the back of mirror backing member 26, a relatively significant snap-open and close force can be provided for the cover 30 for controlling its motion.

It will become apparent to those skilled in the art that various modifications to the preferred embodiment of the present invention can be made without departing from the spirit and scope thereof as defined by the appended claims.

The embodiments of the invention in which an exclusive property or privilege is claimed are defined as follows.

1. An electrical circuit for use in connection with a vanity mirror having a cover thereon comprising:
   a flexible insulative substrate defining first and second circuit panels having a bridge section integrally extending therebetween;
   electrical circuit conductors on said insulative substrate and extending between said first and second circuit panels; and
   electrical circuit elements coupled to said conductors of said first and second circuit panels wherein said first circuit panel is shaped to fit within one of a cover for a vanity mirror and a mirror frame and said second circuit panel is shaped to fit within the other one of said cover for a vanity mirror and said mirror frame such that said bridge section extends between the cover and the mirror frame.

2. The electrical circuit as defined in claim 1 wherein said conductors are printed onto said insulative substrate.

3. The electrical circuit as defined in claim 2 wherein said insulative substrate comprises a film of insulating material.

4. The electrical circuit as defined in claim 3 wherein said circuit includes a dielectric layer over said conductors.

5. The electrical circuit as defined in claim 1 and further including at least one contact terminal mounted to said insulative substrate for mechanical support thereon, said at least one contact terminal also electrically coupled to one of said conductors.

6. The electrical circuit as defined in claim 5 wherein said at least one contact terminal is made of a conductive material formed to include deformable prongs which extend through said insulative substrate and are subsequently bent to attach said at least one contact terminal to said substrate.

7. The electrical circuit as defined in claim 6 wherein said at least one contact terminal is shaped to form a bulb receiving socket.

8. The electrical circuit as defined in claim 6 and further including a plurality of contact terminals and wherein at least another of said contact terminals define a switch contact.

9. The electrical circuit as defined in claim 1 wherein said circuit elements include at least one lamp for providing illumination for the vanity mirror.

10. The electrical circuit as defined in claim 9 wherein said circuit elements include a variable resistance coupled to said lamp.

11. The electrical circuit as defined in claim 10 wherein said variable resistance includes a pad of resistive material on said insulative substrate and coupled to one of said conductors.

12. A covered illuminated vanity mirror visor comprising:
a visor body for mounting to a vehicle;
an illuminated vanity mirror assembly comprising a mirror frame and mirror mounted therein coupled to said vanity mirror visor;
a cover pivotally mounted to said mirror frame for selectively covering said mirror; and
a flexible electrical circuit extending between said cover and said mirror frame, said circuit including a substrate made of a flexible insulating material shaped by a first and second panel integrally joined by a bridge section and having mounted thereto electrical conductors terminating in at least one socket on one of said first and second panels and control means on the other one of said first and second panels with one of said first and second panels extending into said cover, and the other one of said first and second panels extending into said vanity mirror frame.

13. The visor as defined in claim 12 wherein said control means comprises a variable resistance.

14. The visor as defined in claim 12 wherein said control means comprises switch contacts.

15. The visor as defined in claim 12 wherein said conductors are printed onto said insulating material.

16. The visor as defined in claim 15 wherein said insulating material comprises a film.

17. The visor as defined in claim 16 wherein said circuit further includes a dielectric layer over said conductors.

18. The visor as defined in claim 17 wherein said socket is made of a conductive material formed to include deformable prongs which extend through said film and are subsequently bent to attach said socket to said film.

19. The visor as defined in claim 18 and further including a plurality of contact terminals and wherein at least a pair of said contact terminals define switch contacts.

20. The visor as defined in claim 19 wherein said circuit includes a variable resistance which includes a pad of resistive material on said film and coupled to one of said conductors.

21. A covered illuminated vanity mirror comprising:
a mirror frame and mirror mounted therein;
a cover pivotally mounted to said mirror frame for selectively covering said mirror; and
a flexible electrical circuit extending between said cover and said mirror frame, said circuit including a substrate made of a flexible insulating material defining first and second panels integrally joined by a bridge section and having mounted thereto electrical conductors terminating in at least one socket on one of said first and second panels and control means on the other one of said first and second panels with one of said first and second panels extending into said cover, and the other one of said first and second panels extending into said vanity mirror frame.

22. The vanity mirror as defined in claim 21 wherein said control means comprises a variable resistance.

23. The vanity mirror as defined in claim 21 wherein said control means comprises switch contacts.

24. The vanity mirror as defined in claim 21 wherein said conductors are printed onto said insulating material.

25. The vanity mirror as defined in claim 15 wherein said insulating material comprises a film.

26. The vanity mirror as defined in claim 25 wherein said circuit further includes a dielectric layer over said conductors.

27. The vanity mirror as defined in claim 26 wherein said socket is made of a conductive material formed to include deformable prongs which extend through said film and are subsequently bent to attach said socket to said film.

28. The vanity mirror as defined in claim 27 and further including a plurality of contact terminals and wherein at least a pair of said contact terminals define switch contacts.

29. The vanity mirror as defined in claim 28 wherein said circuit includes a variable resistance which includes a pad of resistive material on said film and coupled to one of said conductors.

30. A covered illuminated vanity mirror comprising:
a mirror frame and mirror mounted therein;
a cover and hinge pivotally mounting said cover to said mirror frame for selectively covering said mirror;
at least one lamp mounted to said cover for providing light for use of said mirror; and a flexible electrical circuit extending between said cover and said mirror frame, said circuit including a planar substrate made of a flexible insulating material and having electrical conductors deposited thereon defining at least one socket in said cover for receiving said lamp.

31. A covered illuminated vanity mirror comprising:

a mirror frame and mirror mounted therein;

a cover and hinge pivotally mounting said cover to said mirror frame for selectively covering said mirror;

a lens mounted to said cover adjacent said hinge and extending substantially the width of said cover;

at least one lamp mounted behind said lens for providing a band of light for use of said mirror; and a flexible electrical circuit extending between said cover and said mirror frame, said circuit including a planar substrate made of a flexible insulating material and having electrical conductors deposited thereon defining at least one socket in said cover for holding said lamp, said circuit extending into said vanity mirror frame and including a variable resistance coupled to said socket by said circuit.

* * * * *

UNITED STATES PATENT AND TRADEMARK OFFICE
CERTIFICATE OF CORRECTION

PATENT NO. : 5,428,513
DATED : June 27, 1995
INVENTOR(S) : David L. Hiemstra et al.

Page 1 of 2

It is certified that error appears in the above-indentified patent and that said Letters Patent is hereby corrected as shown below:

On the title page item [57], line 1,

Before "mirror" delete --(--.

Col. 2, line 54;

"tile" should be --the--.

Col. 2, line 57;

"tile" should be --the--.

Col. 3, line 14;

"mariner" should be --manner--.

UNITED STATES PATENT AND TRADEMARK OFFICE
CERTIFICATE OF CORRECTION

PATENT NO. : 5,428,513
DATED : June 27, 1995
INVENTOR(S) : David L. Hiemstra et al.

It is certified that error appears in the above-indentified patent and that said Letters Patent is hereby corrected as shown below:

Col. 4, line 60;

"frown" should be --from--.

Col. 5, line 66;

"frown" should be --from--.

Col. 5, line 68;

"frown" should be --from--.

Signed and Sealed this

Thirty-first Day of October 1995

Attest:

BRUCE LEHMAN

*Attesting Officer*  *Commissioner of Patents and Trademarks*